(12) United States Patent
Platzgummer et al.

(10) Patent No.: US 7,687,783 B2
(45) Date of Patent: Mar. 30, 2010

(54) MULTI-BEAM DEFLECTOR ARRAY DEVICE FOR MASKLESS PARTICLE-BEAM PROCESSING

(75) Inventors: Elmar Platzgummer, Vienna (AT); Hans Löschner, Vienna (AT); Samuel Kvasnica, Vienna (AT); Reinhard Springer, Suiz am Neckar (DE); Mathias Irmscher, Renningen (DE); Florian Letzkus, Tübingen (DE); Jörg Butschke, Stuttgart (DE)

(73) Assignees: IMS Nanofabrication AG, Vienna (AT); Institut fur Mikroelektronik, Stuttgart (DE)

( * ) Notice: Subject to any disclaimer, the term of this patent is extended or adjusted under 35 U.S.C. 154(b) by 154 days.

(21) Appl. No.: 12/038,326

(22) Filed: Feb. 27, 2008

(65) Prior Publication Data

US 2008/0203317 A1    Aug. 28, 2008

(30) Foreign Application Priority Data

Feb. 28, 2007    (AT)    ................................ A 311/2007

(51) Int. Cl.
*H01J 3/14*    (2006.01)
(52) U.S. Cl. .............................. 250/396 R; 250/492.22
(58) Field of Classification Search .............. 250/492.1, 250/492.2, 492.21, 492.22, 492.23, 492.3, 250/396 R
See application file for complete search history.

(56) References Cited

U.S. PATENT DOCUMENTS

| 5,369,282 | A | * | 11/1994 | Arai et al. ............... 250/492.22 |
| 5,801,388 | A | | 9/1998 | Stengl et al. |
| 6,313,023 | B1 | * | 11/2001 | Maruyama .................. 438/597 |
| 6,326,632 | B1 | | 12/2001 | Buschbeck et al. |
| 6,768,118 | B2 | * | 7/2004 | Nakayama et al. .......... 250/397 |
| 6,768,125 | B2 | * | 7/2004 | Platzgummer et al. . 250/492.22 |
| 6,818,911 | B2 | * | 11/2004 | Tamamori et al. ...... 250/492.22 |
| 6,946,662 | B2 | * | 9/2005 | Ono et al. ............... 250/396 R |
| 7,084,411 | B2 | * | 8/2006 | Lammer-Pachlinger et al. ........................ 250/492.1 |
| 2003/0218140 | A1 | * | 11/2003 | Tamamori et al. ......... 250/492.1 |
| 2004/0061064 | A1 | * | 4/2004 | Ono et al. ............... 250/396 R |
| 2005/0242302 | A1 | * | 11/2005 | Platzgummer et al. . 250/492.22 |
| 2008/0203317 | A1 | * | 8/2008 | Platzgummer et al. .. 250/396 R |
| 2008/0283767 | A1 | * | 11/2008 | Platzgummer .......... 250/396 R |

* cited by examiner

*Primary Examiner*—Bernard E Souw
(74) *Attorney, Agent, or Firm*—RatnerPrestia

(57) ABSTRACT

The invention relates to a multi-beam deflector array device for use in a particle-beam exposure apparatus employing a beam of charged particles, the multi-beam deflector array device having a plate-like shape with a membrane region, the membrane region including a first side facing towards the incoming beam of particles, an array of apertures, each aperture allowing passage of a corresponding beamlet formed out of the beam of particles, a plurality of depressions, each depression being associated with at least one aperture, and an array of electrodes, each aperture being associated with at least one electrode and each electrode being located in a depression, the electrodes being configured to realize a non-deflecting state, wherein the particles that pass through the apertures are allowed to travel along a desired path, and a deflecting state, wherein the particles are deflected off the desired path.

27 Claims, 11 Drawing Sheets

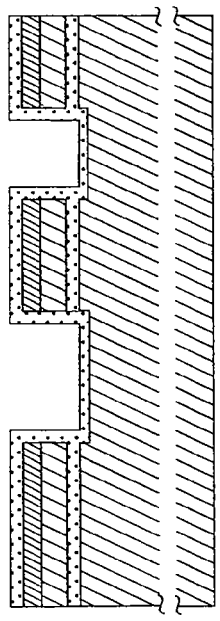
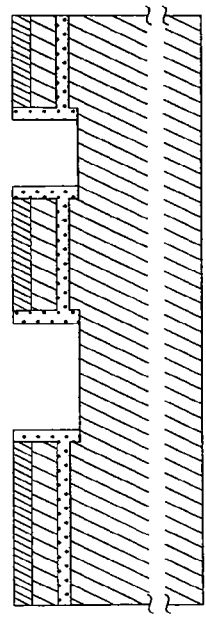
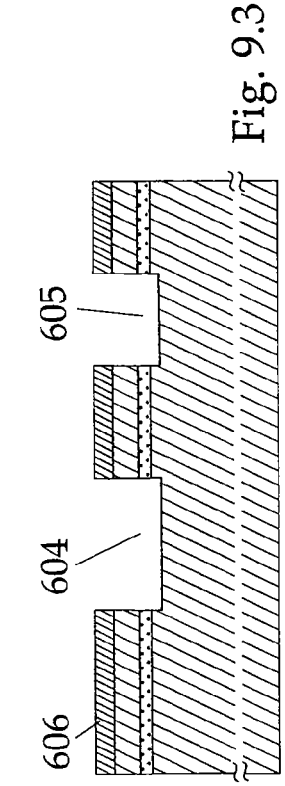
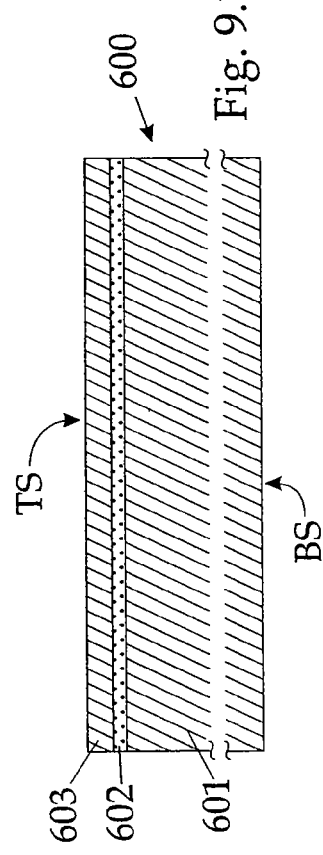
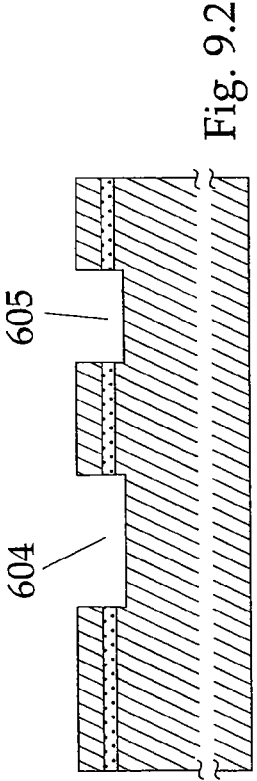
Fig. 9.1 Fig. 9.2 Fig. 9.3 Fig. 9.4 Fig. 9.5 Fig. 9.6

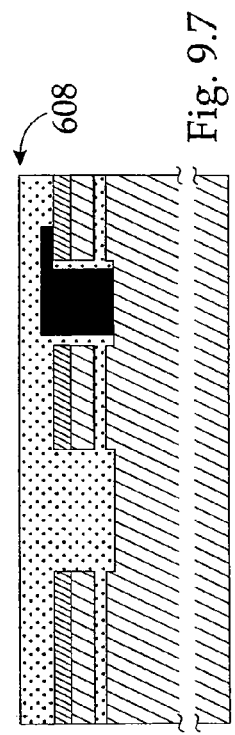
Fig. 9.7
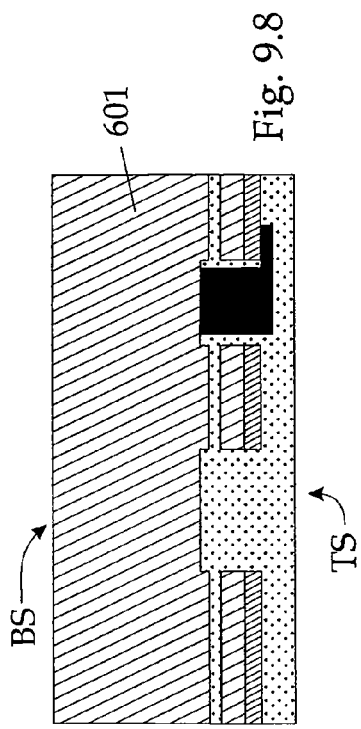
Fig. 9.8
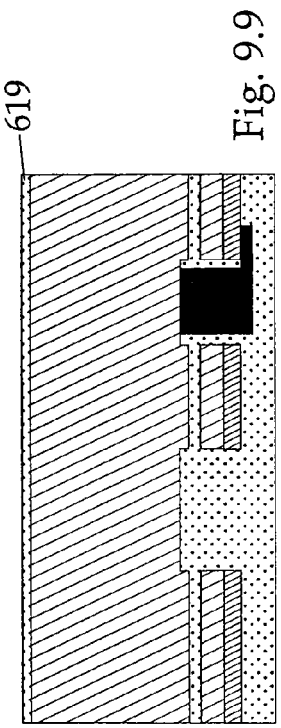
Fig. 9.9
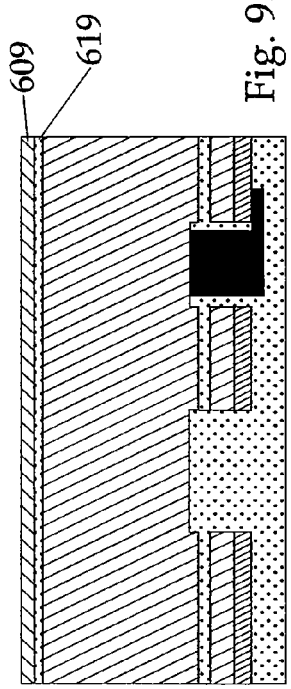
Fig. 9.10
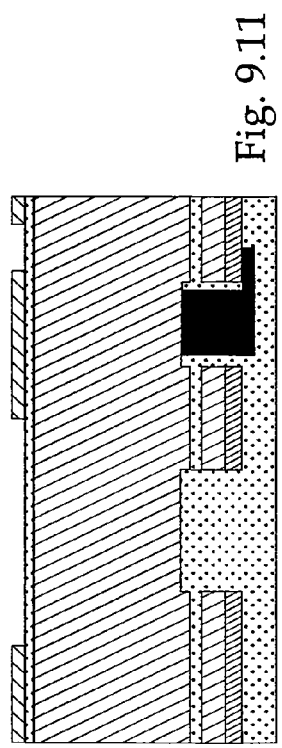
Fig. 9.11
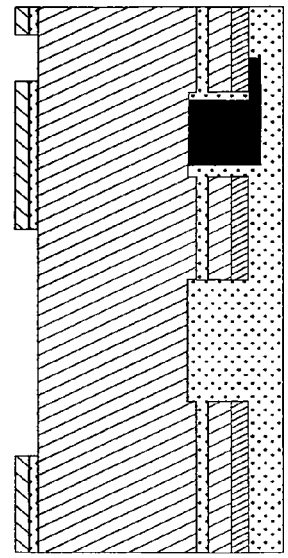
Fig. 9.12

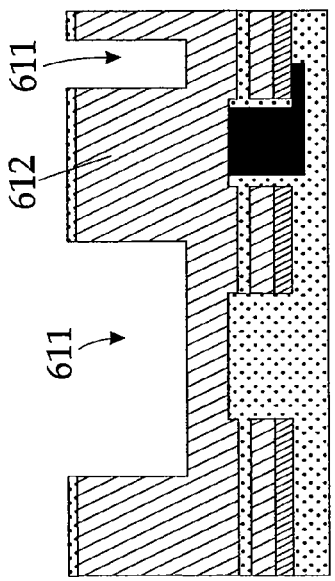
Fig. 9.13
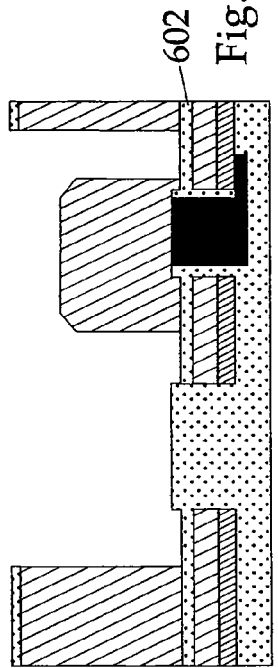
Fig. 9.14
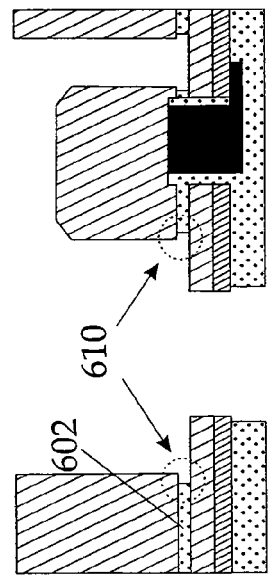
Fig. 9.15
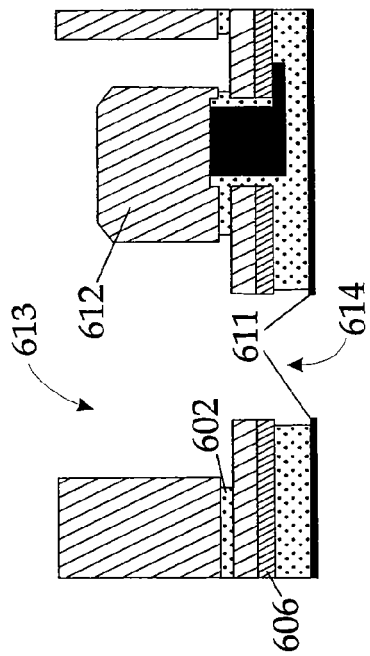
Fig. 9.16

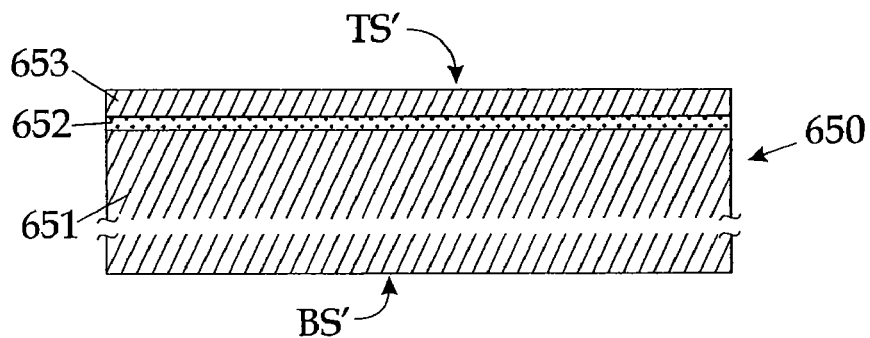
Fig. 15.1
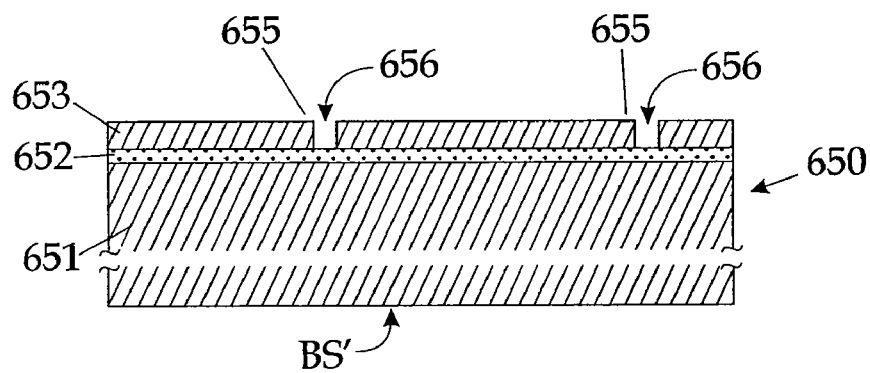
Fig. 15.2
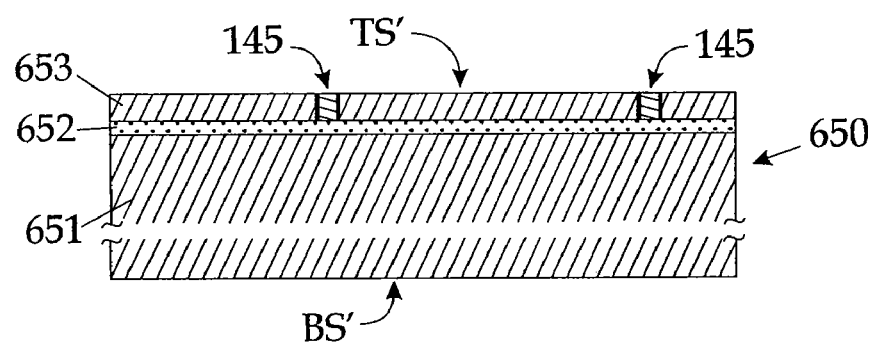
Fig. 15.3
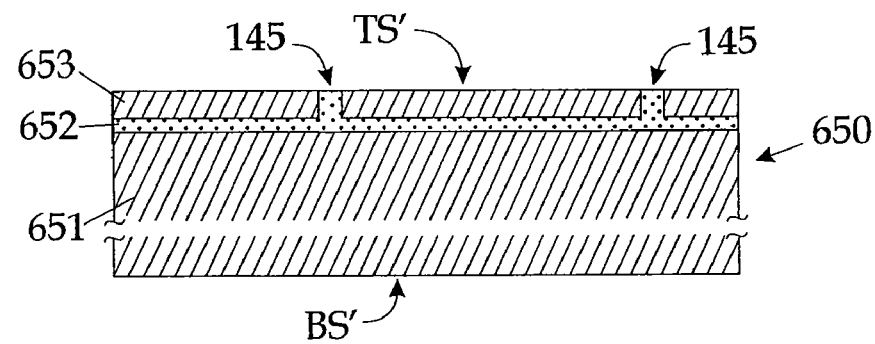
Fig. 15.3a

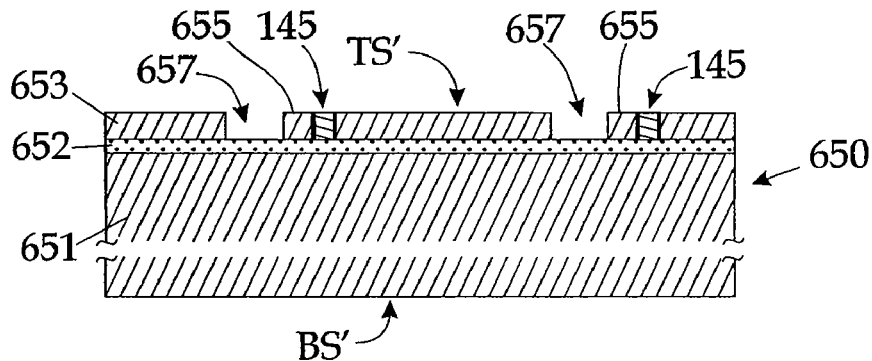
Fig. 15.4
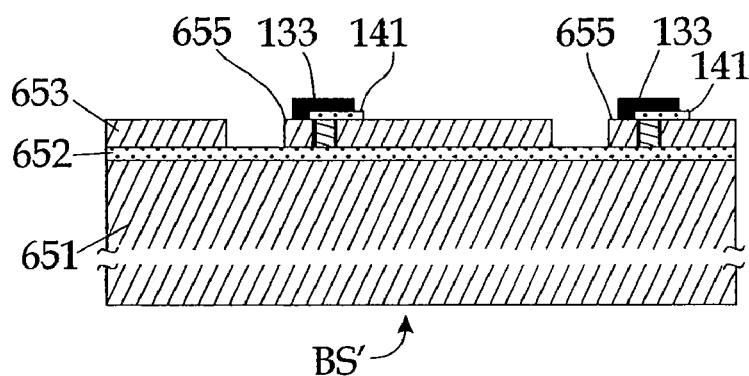
Fig. 15.5
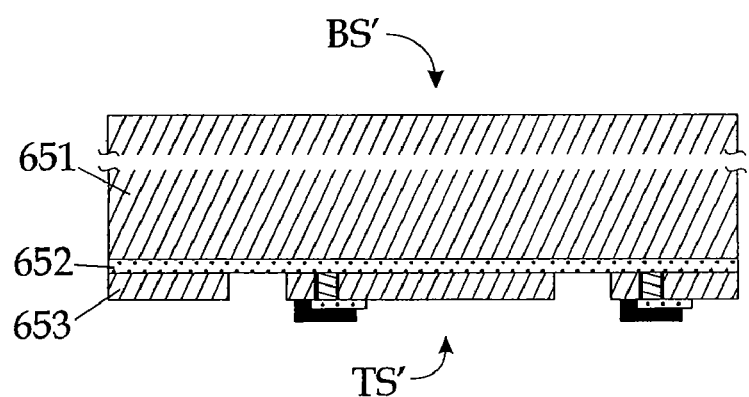
Fig. 15.6
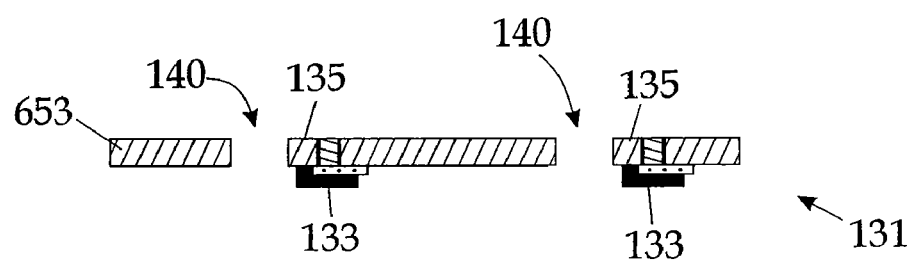
Fig. 15.7

MULTI-BEAM DEFLECTOR ARRAY DEVICE FOR MASKLESS PARTICLE-BEAM PROCESSING

FIELD OF THE INVENTION

The present invention relates to a multi-beam deflector array device for a maskless particle-beam exposure apparatus for forming a pattern on a surface of a substrate by means of a multitude of beams of energetic charged particles. More in detail, the invention relates to a multi-beam deflector array device as part of a pattern definition means for use in a maskless particle-beam exposure apparatus.

Furthermore, the invention relates to a method for producing said multi-beam deflector array device.

BACKGROUND

In a particle-beam exposure apparatus, a particle beam is generated by an illumination system and illuminates a pattern definition means having an array of apertures which define a beam pattern to be projected on a target surface. One important application of a particle-beam exposure apparatus of this kind is in the field of nano-scale patterning, by direct ion beam material modification or by electron or ion beam induced etching and/or deposition, used for the fabrication or functionalization of nano-scale devices. Another important application is in the field of maskless particle-beam lithography, used in semiconductor technology; namely, a lithography apparatus which, in order to define a desired pattern on a substrate surface, processes a substrate, e.g. a silicon wafer, covered with a layer of a radiation-sensitive resist. A desired structure is exposed onto the photo-resist which is then developed, in the case of a positive resist by partial removal according to the pattern defined by the previous exposure step. The developed resist is used as a mask for further structuring processes such as reactive etching.

A particle-beam exposure apparatus is described in the U.S. Pat. No. 5,369,282. Arai et al. therein discuss an electron-beam exposure system using a so-called blanking aperture array (BAA) which takes the role of the pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area of the substrate to be exposed.

The U.S. Pat. No. 6,768,125 by the applicant/assignee presents a multi-beam maskless lithography concept, dubbed PML2 (short for 'Projection Mask-Less Lithography #2'), that employs a pattern definition device comprising a number of plates stacked on top of the other, among them an aperture array device (aperture plate) and a deflector array device (blanking plate). These separate plates are mounted together at defined distances, for instance in a casing.

The aperture plate comprises an array of apertures which define a beam pattern, consisting of beamlets, to be projected on a target surface. Corresponding blanking openings on the blanking plate are associated with said apertures. Said blanking openings are located such that each of the beamlets traverses the blanking opening that corresponds to the aperture defining the beamlet respectively. Each blanking opening is provided with a deflection means that can be controlled by a blanking signal between two deflection states, namely, a first state ('switched on') when the deflection means has assumed a state in which particles passing through the opening are allowed to travel along a desired path, and a second state ('switched off') when the deflection means is deflecting particles transmitted through the opening off said path.

The deflection means comprise a set of beam blanking electrodes, basically a pair. The US 2005/0242302 A1 of the applicant/assignee proposes to form the electrodes around the blanking openings by perpendicular growth employing state-of-the-art electroplating techniques. This document proposes to form one of the electrodes, which is called ground electrode, so as to have a substantial height over the blanking plate and the other electrode, which is called blanking electrode. This is done in order to provide a better shielding of the blanking apertures against cross-talking and other unwanted effects.

There are several problematic issues in the use of pattern definition devices as described in prior art. The shielding of the blanking apertures against cross-talking, for instance, as well as a non-expensive way of producing said blanking device. In particular the forming of the electrodes employing perpendicular growth is a rather complex process. Additionally such electrodes are very sensitive to deformation and stress.

Moreover, electrodes that have a substantial height over the blanking plate impose a limitation of the electric field strength tolerable in the vicinity of the blanking plate (this is due to stray fields around the electrodes caused by the boundary conditions for the field lines). This represents a disadvantage particularly if the blanking plate is used as a part of a grid lens (as for example described in U.S. Pat. Nos. 5,801,388 and 6,326,632 by the applicant/assignee) where the side of the blanking plate comprising the electrodes is used to define the electrostatic potential of the negative (diverging) and/or positive (collecting) electrostatic lens.

In prior art the pattern definition means comprises at least two different plates for comparably high integration density of apertures and deflectors, namely an aperture plate used to form the shape of the beams and absorb the majority of heat load imposed by the incoming beam, and a blanking plate used as deflector array plate. Highly accurate alignment between the two or more plates and excellent alignment towards the direction of the incoming beam is required.

SUMMARY OF THE INVENTION

The present invention sets out to overcome the above-mentioned shortcomings of the prior art. In particular, the layout of a pattern definition device shall be improved to become a layout which lends itself to a production by inexpensive state-of-the-art processes.

This task is solved according to the invention by a multi-beam deflector array device for use in a particle beam exposure apparatus employing a beam of charged particles, said multi-beam deflector array device having an overall plate-like shape with a membrane region comprising a first side facing towards the incoming beam of particles and a second side opposite to the first side, an array of apertures, each aperture allowing passage of a corresponding beam element formed out of said beam of particles, a plurality of depressions, each depression being formed in one of the sides of the membrane region and associated with at least one of the apertures, the membrane region further comprising an array of electrodes, wherein each aperture is associated with at least one of said electrodes and each electrode is located in one of said depressions, the electrodes being configured to realize a non-deflecting state, wherein the particles that pass through the apertures are allowed to travel along a desired path, and a deflecting state, wherein the particles are deflected off the desired path.

By virtue of this solution, the positioning of the electrodes within the depressions has the advantage of minimizing cross-talk between the apertures since they are shielded by the substrate material of the multi-beam deflector array device (from now on referred to as deflector array plate DAP). Furthermore, in view of the unavoidable thermal heat load related to the electric power consumption of the integrated circuit operated at high frequency, the crucial cross section for thermal conduction along the membrane towards the thicker carrier frame holding the membrane is largely improved as the space between the deflectors, according to a preferred embodiment of the invention, is filled with thermally conductive material. At least one electrode will serve as active deflecting electrode while the associated element for electrical grounding can be realized either with a second electrode or, in a preferred variant, by using the substrate material of the DAP as ground electrode.

In one variant of the invention, the depressions are formed in the first side of the DAP, i.e. the side directed towards the beam source.

In an alternative variant of the invention, the depressions are formed in the second side of the DAP, i.e. facing towards the target. By combining the aperture plate with the DAP into one plate, the size of the pattern definition system can be further reduced. This variant is made possible by the quality of the invention that no significant field extends into the space beyond the pattern definition system. The reason for this is that the electrodes which are energized for beam switching are placed inside the depressions and do not lead to any significant changes of the electrostatic field outside the depressions. The electrostatic field in the space beyond the pattern definition system is formed by the electrostatic potential applied to the membrane surface and the potentials of neighboring electrodes (e.g. ring electrodes), whereas the depressions and electrodes therein do not give rise to significant stray fields in this region. This is of particular importance whenever the pattern definition means is used in conjunction with an external electrostatic field as grid lens mask (as for example described in U.S. Pats. No. 5,801,388 and 6,326,632 by the applicant/assignee).

In another variant of the invention, a beam forming layer is provided on the first side of the membrane region, with a plurality of retrograde stencil openings formed in said beam forming layer, each of said stencil openings coinciding with a subsequent aperture in the membrane region, each of said stencil openings having an inner width that is smaller than the inner width of the corresponding aperture. That is to say the apertures in the membrane region comprise retrograde stencil openings in said beam forming layer. 'Retrograde' here means that the stencil openings in the beam forming layer have an inner width smaller than the inner width of the apertures in the membrane region.

The beam forming layer if present is used to define the shape of the beamlets out of the incoming beam of particles. By this means a pattern definition system can be realized with a single plate. A separate cover plate and an aperture plate, as provided in prior art, can be omitted. Thus the dimensions as well as the cost of production can be reduced.

Advantageously, the membrane region of the DAP may be composed of a substrate material that is semiconducting. In particular, the substrate material may be silicon. Semiconducting material allows for the employment of CMOS-technology for structuring the integrated circuit and further well tested micro-structuring techniques for processing the substrate material. In the area of the electrodes where electrostatic potentials have to be changed rapidly and electrical field strengths have to be built up in order to deflect the particles, doped silicon, e.g. with a conductivity of approximately 5 mΩcm, might be used. Adequate values of the dielectric constant $\in$ and the electrical conductivity $\sigma$ are used to optimize the dynamic behavior and function of the multi-beam deflector array device according to the invention for the desired frequency of operation.

In a suitable variant of the invention there is a buried insulating layer between the electrodes and a layer containing circuitry for controlling said electrodes. Preferably said buried insulating layer may consist of silicon oxide $SiO_2$ and may extend over the entire membrane region. The insulating layer is used to separate the region of doped silicon (for conductive electrodes) from the integrated circuit (IC), e.g. a CMOS-layer.

Preferably but not necessarily, the electrodes consist of the same material as the substrate material of the membrane region. This simplifies the production of the DAP according to the invention. Contrary to prior art, e.g. US 2005/0242302 A1, the electrodes do not have to be formed by perpendicular growth. Furthermore the electrodes may be coated with a metallic material. Additionally to the protective effect of such a coating its good conductivity allows for the discharge of electrical charge caused by the beam of charged particles.

Preferably, the electrodes do not protrude out of a surface level of the side of the membrane region the depressions are formed in. This means that the electrodes may have a height below or equal to this surface level. Thereby cross-talk between the apertures as well as a spread of the electrical field produced by the electrodes can be reduced effectively.

In an advantageous embodiment of the invention, the deflecting electrodes are contacted from the side of the membrane region opposite to the side of the membrane region the depressions are formed in.

Preferably the depressions have a diameter, in the sense of inner width, which is smaller than the distance between the first and the second side of the membrane region.

By configuring the substrate material of the DAP to act as ground electrode to the deflecting electrode, the production of individual ground electrodes providing ground potential is dispensable and the fabrication process of said device can be simplified. For this variant it is useful to provide a buried insulating layer between the deflecting electrodes and the substrate material, as for example $SiO_2$ in a silicon-on-insulator (SOI) wafer.

In another variant of the invention, each aperture with at least one deflecting electrode may be associated with at least one ground electrode which is located in the depression that surrounds the aperture. In this case, it is preferable that the ground electrode and the deflecting electrode do not protrude out of a surface level of the side of the membrane the depressions are formed in. This allows for reducing the size of the pattern definition system as well as for minimizing cross-talk between the apertures.

Furthermore the invention includes a method for producing a multi-beam deflector array device for use in a projection lithography system, namely a particle beam exposure apparatus, from a silicon-on-insulator (SOI) wafer blank with a layer of bulk material, a buried insulator layer (e.g., silicon oxide layer) covered by a silicon layer on a topside of the SOI wafer blank, opposite of a backside of said wafer blank, the method being characterized by the following steps:

a) structuring of recesses on the topside of the SOI wafer blank, reaching through the silicon layer and the buried insulator layer into the layer of bulk material, b) production of a CMOS-layer on the topside of the SOI wafer blank on top of the silicon layer, c) deposition of a protective insulating layer on the topside of the SOI wafer blank, d) structuring of the backside of the SOI wafer blank employing lithographic methods and forming electrodes as well as apertures extending through to the corresponding recesses on the topside of the SOI wafer blank that have been structured earlier.

Additionally, after step b) an insulating layer may be deposited on the topside of the SOI wafer blank, covering the topside of the SOI wafer blank.

Before step c), metal via contacts may be applied to selected recesses on the topside of the SOI wafer blank that were produced in step a).

In a possible variant of the method, before step d) the backside of the SOI wafer blank in the membrane region may be thinned, e.g. to a thickness of 50 μm. This may be done using well known techniques like chemical-mechanical-polishing (CMP).

After step d), a protective metal layer may be deposited on the structures on the topside of the SOI wafer blank. This layer can be used to discharge the surfaces that are exposed to the charged particles of the particle-beam exposure apparatus.

Preferably, in step d) the buried insulator layer is undercut during the lithography while employing reactive ion etching (RIE). This measure prevents that the buried silicon oxide layer collects an electrical charge when it is hit by electrically charged particles from the charged particle beam.

The invention also includes a further method for producing a multi-beam deflector array device according to the invention, characterized by the following steps:

a) structuring of recesses on the topside of the SOI wafer blank, reaching through the silicon layer to at least the buried insulator layer, said recess at least partially surrounding a respective portion in the silicon layer, b) at least partial filling of the recesses with a support material, c) restructuring of the recesses on the topside reaching through the silicon layer to at least the buried insulator layer, in a manner such that each of the recesses is formed into a shape wherein the resulting recess—including regions filled with said support material—(which corresponds to the above-discussed depression of the device according to the invention) surrounds the respective portion in the silicon layer completely (i.e., completely with regard to the silicon layer), electrically separating said portions from the silicon layer, d) providing electrical contact means for said portions with the electrical contact means being electrically insulated against the rest of the silicon layer, and e) structuring the backside of the SOI wafer blank, forming apertures extending through to the corresponding recesses that have been structured in an earlier step on the topside.

Step d) of this method may be realized by forming an insulating layer onto the topside in specified areas at least adjacent to the locations of said portions, on which the electrical contact means are formed realizing contact pads.

Preferably, in step e), the backside may be thinned in the membrane region, and more preferably removing the insulator layer in the thinning process.

BRIEF DESCRIPTION OF THE DRAWINGS

In the following, the present invention is described in more detail with reference to the drawings, which show schematically:

FIGS. 9.1 to 9.16 a diagrammatic sequence illustrating the fabrication of a multi-beam deflection array device of the type shown in FIG. 8;

FIGS. 15.1 to 15.7 a diagrammatic sequence illustrating a fabrication process of a deflection array means of the type shown in FIGS. 13 and 14;

DETAILED DESCRIPTION OF THE INVENTION

The preferred embodiments of the invention discussed in the following are related to a PML2-type particle-beam exposure apparatus with a pattern definition system as disclosed in the U.S. Pat. No. 6,768,125 (=GB 2,389,454 A) of the applicant/assignee, and with a large-reduction projecting system. In the following, first the technical background of the apparatus is discussed as far as relevant to the invention, and then embodiments of the invention are discussed in detail. It should be appreciated that the invention is neither restricted to the following embodiments nor to a pattern definition system, which merely represents one of the possible implementations of the invention.

PML2

Figure 1:
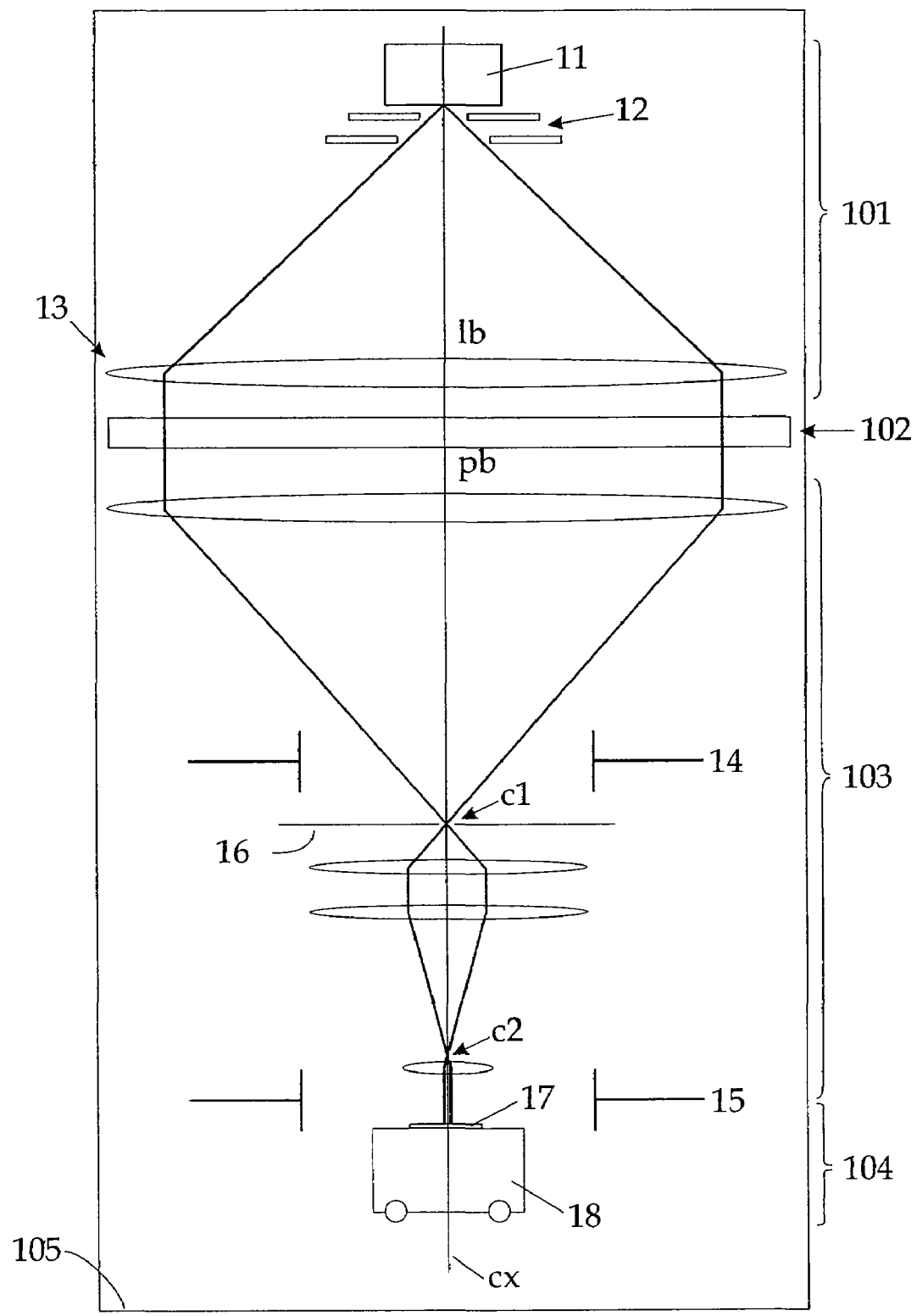
FIG. 1 in a longitudinal section a layout of a particle beam exposure apparatus to which the invention applies.

FIG. 1 shows an overview of a lithographic apparatus. For the sake of clarity, the components are not shown to size. The main components of the lithography apparatus 100 are—corresponding to the direction of the lithography beam lb, pb which runs vertically downward in FIG. 1—an illumination system 101, a pattern definition system 102, a projecting system 103 and a target station 104 with a substrate 17 on a wafer stage 18. The present invention relates only to the pattern definition system 102. Nevertheless, the lithographic apparatus is described first to give an example for a possible application of the invention.

The whole apparatus 100 is contained in a vacuum housing 105 held at high vacuum to ensure an unimpeded propagation of the beam lb, pb along the optical axis cx of the apparatus. In the embodiment shown, the particle-optical systems 101, 103 are largely realized using electrostatic lenses; it should be noted that other implementations such as electromagnetic lenses may be used as well.

The illumination system 101 comprises an electron or ion source 11 fed by a gas supply (not shown) and an extraction system 12. In one embodiment, helium ions (He$^+$) are used. It should, however, be noted that in general other electrically charged particles can be used as well. Apart from electrons these can be, for instance, hydrogen ions or heavy ions; in the context of this disclosure heavy ions refer to ions of elements heavier than C, such as O, N, or the noble gases Ne, Ar, Kr, Xe. It is also possible to use negatively charged ions such as negative hydrogen ions or carbon fullerene ions.

The ion source 11 emits energetic particles, i.e. having a defined (kinetic) energy of typically several keV, e.g. 10 keV. By means of an electro-optical condenser lens system 13, the particles emitted from the source 11 are formed into a wide, substantially telecentric particle beam serving as lithography beam lb. The lithography beam lb then irradiates the pattern definition system 102, described in more detail below. The lithography beam lb irradiates a plurality of apertures in the pattern definition system 102. Some of the apertures are "switched on" or "open" so as to be transparent to the incident beam; the other apertures are "switched off" or "closed", i.e. non-transparent to the beam, meaning that the beamlet does not reach the target. The pattern of switched-on apertures is chosen according to the pattern to be exposed on the substrate 17, as these apertures are the only portions of the pattern definition device transparent to the beam lb, which is thus formed into a patterned beam pb, consisting of a plurality of beamlets.

The pattern as represented by the patterned beam pb is then projected by means of a charged particle projection system 103 onto the substrate 17 where it forms an image of the switched-on apertures of the pattern definition system 102. The projection system 103 implements a demagnification of, for instance, 200 times with two crossovers c1, c2. If a beamlet is deflected off its switched-on path by the pattern definition system 102, it is absorbed in a stop-plate 16, for instance.

The substrate 17 may be a silicon wafer covered with a resist layer which is sensitive to the particle beamlets. The wafer is held and positioned by a wafer stage 18 of the target station 104. Correction of image position and distortion can be done by means of multipole electrodes 14 and 15.

Figure 2:
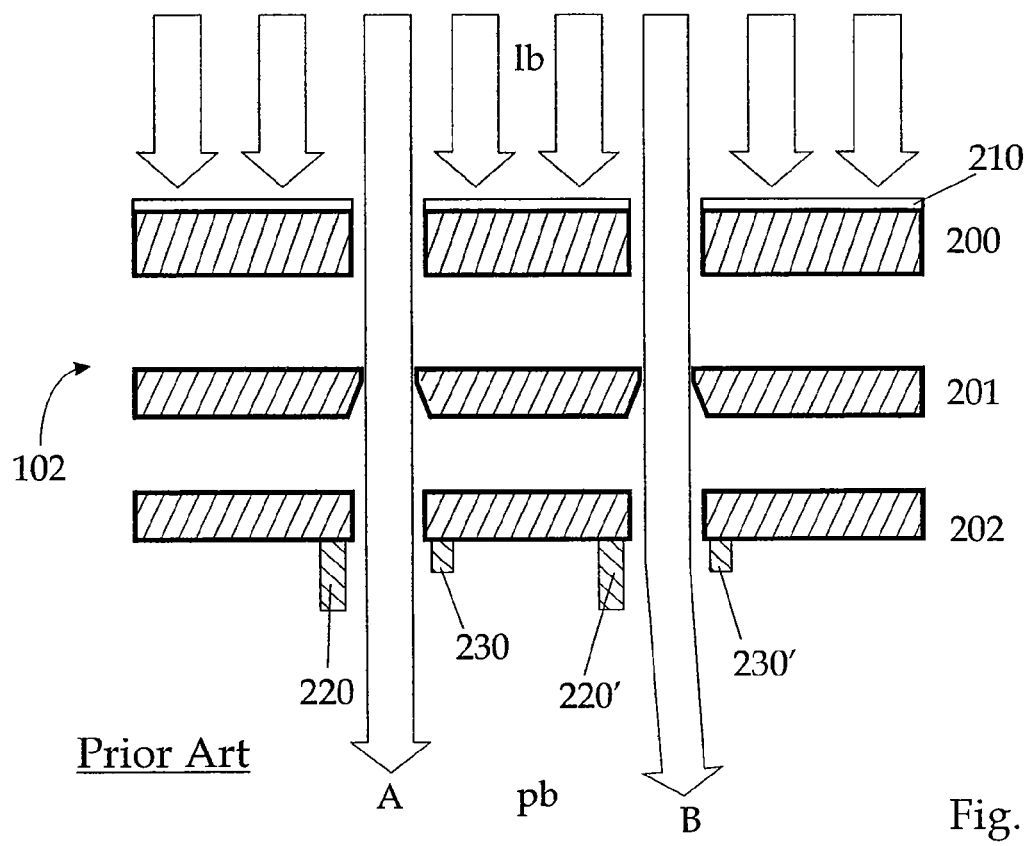
FIG. 2 a longitudinal sectional detail of a prior art pattern definition system suitable for the lithography apparatus of FIG. 1 according to prior art.

FIG. 2 shows the operating mode of the pattern definition system 102 with a prior-art embodiment as described e.g. in the U.S. Pat. No. 6,768,125 by the applicant/assignee. Only those details are given as needed to disclose the operation. It should be noted that in FIGS. 2 to 5, the dimensions in the longitudinal axis are enlarged and not to scale. The pattern definition system 102 comprises a number of plates, mounted in a stacked configuration, realizing a composite device whose components serve respective functions. Each of the plates is preferably realized as a semiconductor (in particular silicon) wafer in which the structures have been formed by micro-structuring techniques known in the art. The lithography beam lb traverses the plates through an array of apertures. Each aperture corresponds to a set of consecutive openings which are defined in said plates.

The first plate in the direction of the incoming beam is a cover plate 200. By absorbing the majority of the impingent lithography beam lb, said cover plate 200 serves to protect the subsequent plates from irradiation damage. For this purpose it may be coated with a resistive layer 210. The lithography beam lb traverses the cover plate through a plurality of apertures of which only two are shown in FIG. 2 and the subsequent figures.

The cover plate 200 is followed by an aperture array plate 201 with an array of openings which serves to define the shape of the beamlets. Each opening corresponds to a respective aperture of the cover plate 200. The openings of the aperture array plate 201 have a width that is smaller than the width of the respective openings in the cover plate 200.

Following the aperture array plate 201 in the direction of the particle beam, a DAP 202 is positioned. This plate serves to switch off the passage of selected beamlets; it has a plurality of openings, each corresponding to a respective aperture of the aperture array plate 201 and being provided with a deflection means that is individually controlled to deflect particles radiated through the opening off their path. Said deflection means may consist of a deflecting electrode 230, 230' and a ground electrode 220, 220' respectively. The electrodes are free-standing with respect to the DAP. In the embodiment of FIG. 2, said electrodes may be formed by perpendicular growth employing state of the art techniques.

For instance, beamlet A permeates the subsequent openings of the pattern definition system 102 without being deflected, since the respective deflecting electrode 230 is not energized, meaning here that no voltage is applied to the deflecting electrode 230. This corresponds to the "switched on"-state of the aperture. Beamlet A passes the pattern definition system 102 unaffected and is focused through the first crossover c1 by the particle-optical system 103 (FIG. 1).

In contrast, by energizing, i.e. applying a transverse voltage to the deflecting electrode 230', associated with beamlet B, a "switched off"-state is realized. In this state, the deflecting electrode 230' deflects the beamlet B off its path. As a consequence the beamlet B is directed away from the first crossover c1 and hence is absorbed in the stop-plate 16. The beam deflection angles are exaggerated in FIGS. 2 to 5 and generally very small, typically 0.5 to 5 thousands of a radian.

The pattern of switched-on apertures is chosen according to the pattern to be exposed on the substrate 17, as these apertures are the only portions of the pattern definition device transparent to the beam lb, which is thus formed into a patterned beam pb emerging from the apparatus.

Single-Plate DAP

Figure 3:
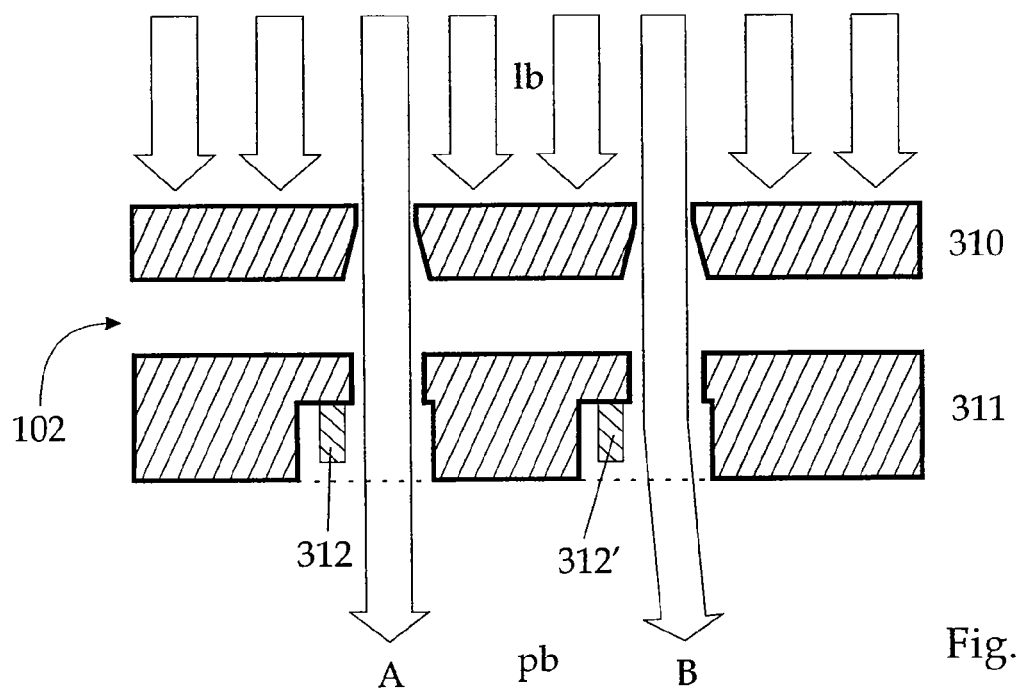
FIGS. 3 to 5 longitudinal sectional details of embodiments of the pattern definition system according to the invention suitable for the lithography apparatus of FIG. 1, FIGS. 6 and 7 different realizations of deflecting electrodes, FIG. 8 an enlarged sectional view of an aperture within a multi-beam deflecting array device according to the invention.
Figure 4:
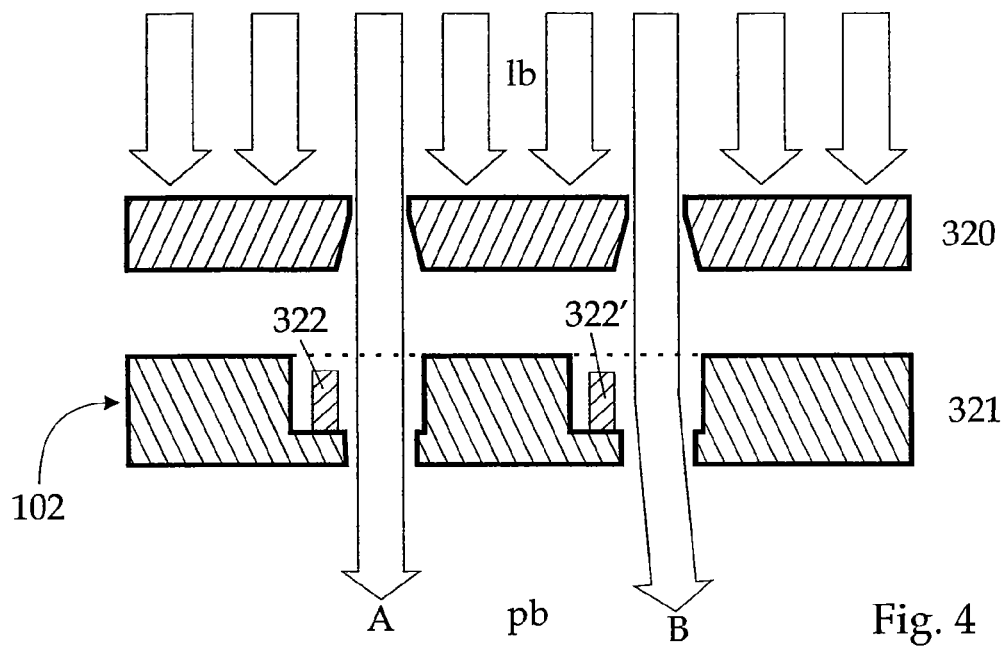
Figure 5:
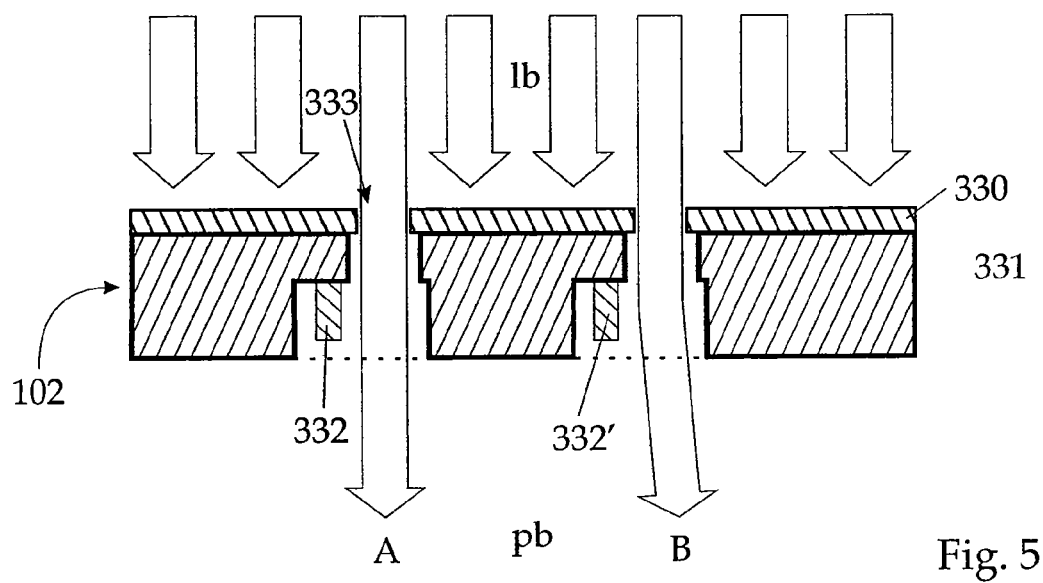

FIGS. 3 to 5 depict different embodiments of a pattern definition system according to the invention with the DAP realized by a single plate. In FIG. 3 the aperture array plate 310 is combined with the function of the cover plate to a "beam forming plate" which is positioned above the DAP 311. The aperture array plate 310 has a sufficient thickness to allow for dissipating the thermal load caused by the impingent particles of the charged particle beam lb. The deflecting means is realized by only one deflecting electrode 312, 312' per aperture. The substrate material of the DAP 311 is configured to act as ground electrode for the deflecting electrodes 312, 312'. Contrary to prior art, the deflecting electrodes 312, 312' are not free-standing, but located within depressions 313, 313' formed around the apertures on the side of the DAP opposing the incoming particle beam. The electrodes 312, 312' do not protrude beyond the surface level of this side. Such an arrangement has the advantage of reducing the overall size of the pattern definition system.

FIG. 4, while showing the same sequence of functional plates as FIG. 3, differs in the realization of the DAP 321: Here the depressions around the apertures are formed on the side of the DAP facing the incoming particle beam. By placing the deflecting electrodes 322, 322' in the depressions, the deformation of the electric field gradient outside the interstitial space between the aperture array plate 320 and the DAP 321 can be prevented.

In a variant of the invention, depicted in FIG. 5, a modified DAP 331 is used as a pattern definition system, combining the tasks of a cover plate, an aperture plate and a deflector plate into one plate. A beam forming layer 330, provided on the first side of the DAP 331, is used to define the shape of the beamlets. The beam forming layer 330 can be part of the membrane or can be added in a consecutive process step, as for example evaporation of a metal, electroplating or bonding of a separate layer to the DAP 331. The apertures of the DAP 331 comprise retrograde stencil openings 333 in the beam forming layer 330. 'Retrograde' in this context means that the inner width in the stencil openings 333 of the beam forming layer 330 is smaller than the inner width in the subsequent aperture of the DAP 331. The inner width of the stencil openings 333 may either be constant throughout each stencil opening or increase with the direction of the beam, widening towards the side facing away from the incoming beam. The word 'retrograde' is used here to signify that the inner width of the apertures of the DAP 331 is smaller in the stencil openings in the beam forming layer 330 than in the subsequent aperture. The beamlets are deflected by deflecting electrodes 332, 332' located in depressions which are formed in the DAP 331 on the side opposing the incoming beam of particles.

The embodiments of the invention shown in FIGS. 3 to 5 comprise one deflecting electrode per aperture cooperating with the substrate material of the DAP configured to act as associated ground electrode. For the sake of completeness, two alternative arrangements of deflecting electrodes and ground electrodes shall be presented briefly.

Figure 6:
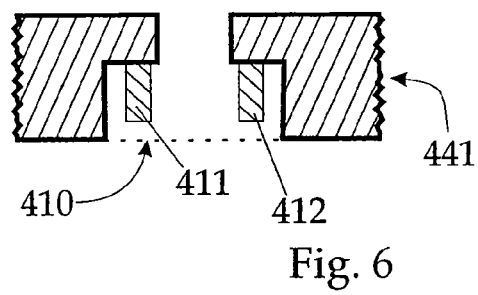

FIG. 6 shows a section of a DAP 441 with an aperture to be traversed by a beamlet of charged particles. Located in a depression 410 two deflecting electrodes 411, 412 with the same height are provided to deflect said beamlet. The depression may be formed on either side of the DAP 441. With such an arrangement bipolar deflection can be realized by energizing either deflecting electrode 411, 412 with the substrate material of the DAP 441 configured to act as ground electrode.

Figure 7:
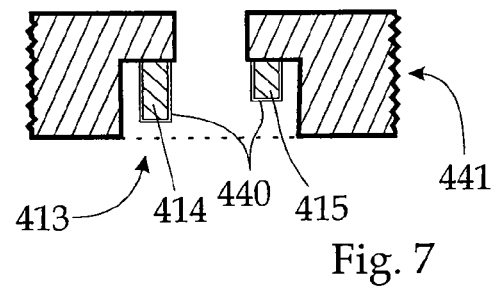

FIG. 7 shows an arrangement with a deflecting electrode 415 and a ground electrode 414 formed in a depression 413, whereas said arrangement may be located on either side of the DAP 441. The ground electrode 414 outranges the deflecting electrode 415 in height, whereas neither electrode protrudes beyond the surface level of the side where the depression 413 is formed in.

Furthermore, as shown for example with the embodiment of FIG. 7, either or both types of electrodes 414, 415 may be coated with a metallic material 440.

Figure 8:
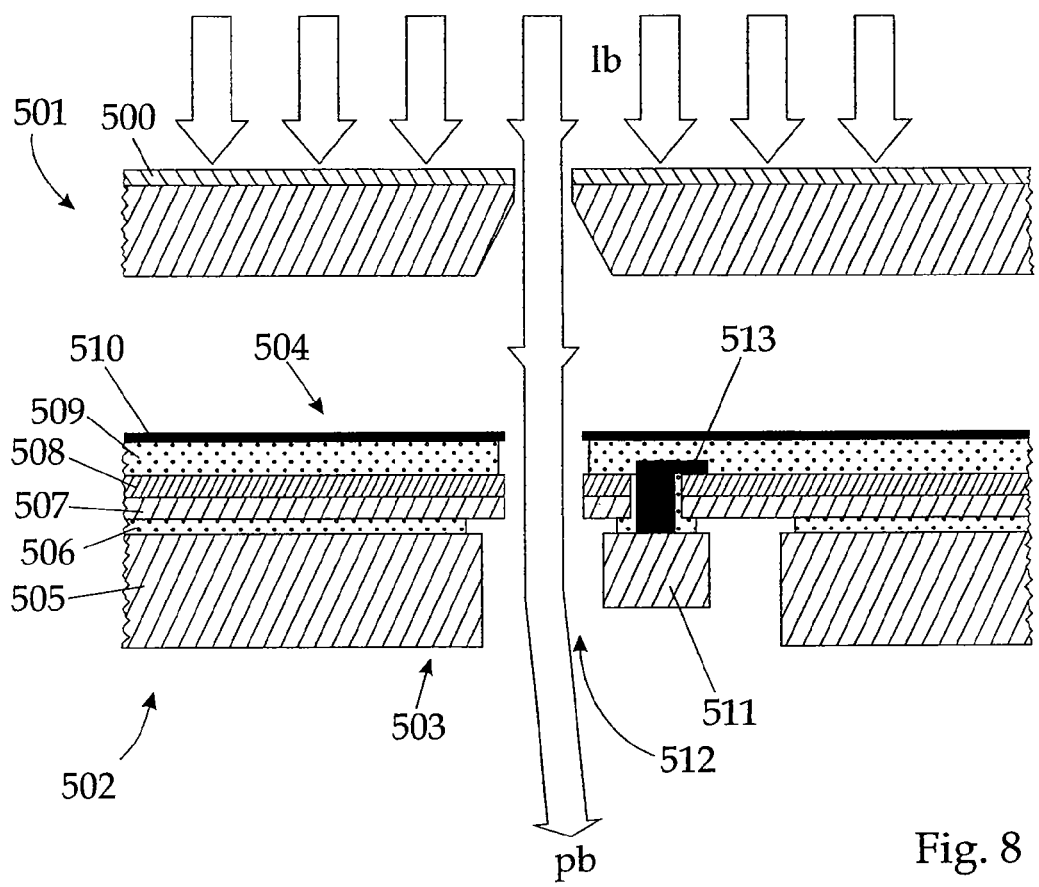

FIG. 8 shows a more detailed section of an aperture plate 501 and a DAP 502 according to the invention, corresponding to the embodiment of FIG. 3; only one aperture is depicted for the sake of clarity. On the side towards the incoming beam of particles lb the aperture plate 501 is covered with a resistive layer 500 for protection against radiation damage. The DAP 502 has a basically plate-like shape. Its first side 504 is directed towards the incoming beam of particles, with the second side 503 opposing.

The DAP comprises a layer of bulk material (bulk layer) 505 made of a semiconductor, preferably doped silicon with a conductivity of around 5 mΩcm. This layer defines the ground potential and serves as a substrate material for the DAP in the membrane region. The layer of bulk material also allows for dissipating any thermal heat load related to the electric power consumption of integrated circuits operated at high frequency, providing for the electronic operation of the DAP 502. An insulating layer 506, e.g. silicon oxide, is provided on the layer of bulk material 505 on the side facing towards the incoming beam of particles. Another silicon layer 507 is provided on this insulating layer 506. The thickness of the layer of bulk material 505 is around 50 μm. The thickness of the insulating layer 506 is about 300 nm, the silicon layer 507 typically measures 2 to 3 μm.

A CMOS-circuit layer 508 is produced on the side of the silicon layer 507 facing towards the incoming beam of particles. This CMOS-circuit layer 508 contains the electronic components (not shown) to provide for the electronic operation of the DAP 502. The insulating layer 506 shields the silicon layer 507 and the CMOS-circuit layer 508 against the bulk layer 505.

The CMOS-circuit layer 508 is covered with an insulating protective layer 509 consisting of silicon oxide, for instance. A protective metal layer 510 is superimposed on the insulating layer 509 to avoid charging.

In the embodiment of the present invention depicted in FIG. 8, the deflecting electrode 511 is located in a depression 512 which is formed in the second side 503 of the DAP 502. Alternatively, said depression may be formed in the first side 504. Either realization is part of the present invention.

The deflecting electrode 511 consists of the same material as the bulk layer 505. The electrode is formed out of the substrate material of the DAP 502 employing lithographic processes. A metal via contact 513 connects the deflecting electrode 511 with the CMOS-layer 508, which comprises the electric supply lines and controlling circuits of the electrode. In the present embodiment, the bulk layer 505 of the DAP 502 serves as ground electrode for the deflecting electrode 511.

Fabrication Process

In the following, one possible way of fabricating a DAP according to the invention is presented.

FIGS. 9.1 to 9.16 illustrate an exemplary fabrication process for producing the DAP 502 of FIG. 8. Shown are cross sections of the wafer being processed according to the subsequent steps 1 to 16 of the process. For the sake of clarity the fabrication is explained by focusing on one depression and its associated deflecting electrode. Of course a DAP 502 consists of a plurality of depressions and electrodes, therefore the following explanation represents no restriction of any kind to the present invention.

A silicon-on-insulator (SOI) wafer blank 600 is the base material for the fabrication process shown in FIG. 9. The wafer blank 600 has a thickness of e.g. 650 μm—FIG. 9.1. It comprises a bulk layer 601, a buried silicon oxide layer 602 which is e.g. 300 nm thick and a silicone layer 603 of e.g. 2 μm thickness. Henceforth the side with the silicon layer 603 will be called topside TS of the SOI wafer 600 whereas the opposite side will be referred to as backside BS.

Topside TS and backside BS of the SOI wafer 600 contain alignment marks (not shown in FIGS. 9.1 to 9.14, see FIG. 10) to allow for accurate alignment of structures processed on either side with respect to each other. The alignment marks are fabricated by standard double-sided photolithography and etching techniques. The alignment marks on the topside TS of the SOI wafer reach through the silicone layer 603 until the buried silicon oxide layer 602. The depth of the alignment marks on the backside BS of the SOI wafer has to be in such a way as to allow for precise function of the alignment marks throughout the whole fabrication process. The precision of the alignment between alignment marks on the topside TS and the backside BS of the SOI wafer 600 is about 0.1 µm with state-of-the-art techniques. Advanced systems allow for better front-to-backside alignment precision. The number of alignment marks is user-defined, at least two marks per DAP should be allotted.

In a first step of the fabrication process, recesses 604, 605 are produced on the topside TS of the wafer 600 by employing reactive ion etching (RIE) techniques—FIG. 9.2. The recesses 604, 605 extend through the silicon layer 603 and the insulating layer 602 of silicon oxide into the bulk layer 601. The recess 605 is designed to accommodate the via contact between the deflecting electrode and the CMOS-layer 606, produced in the following step.

In a next step, a CMOS-circuit layer 606 is produced on the silicon layer 603 on the topside TS of the wafer 600. This layer contains all the electronic components to control the DAP. Although the production of the CMOS-layer 606 comprises a sequence of steps, it is depicted as only one step in FIG. 9.3, since the production of such a layer is a well-established technique. It is also possible to begin the production process by producing a CMOS-circuit layer 606 and to continue with the production of recesses as mentioned above and the other production steps mentioned below.

Via oxide deposition, the topside TS of the wafer is coated with an insulating layer of silicon oxide—FIG. 9.4. The insulating layer is then removed by employing RIE (FIG. 9.5), whereat said layer remains at the vertical parts of the topside TS of the wafer due to the anisotropic characteristics of RIE.

Subsequently a metal contact 607 is applied into the recess 605 to provide for a connection between the CMOS-layer 606 and the electrode to be—FIG. 9.6. The next fabrication steps concern the backside BS of the wafer 600. Therefore an insulating layer 608 is deposited on the topside TS of the wafer to protect the surface—FIG. 9.7. From now on the cross-section of the processed wafer is depicted upside down in FIGS. 9.8-9.16.

By applying known etching techniques to the backside BS of the wafer 600, a membrane region is created: The thickness of the layer of bulk material 601 is reduced from 650 µm to e.g. 50 µm by employing standard wafer thinning techniques—FIG. 9.8. The individual steps for this standard process, e.g. KOH wet chemical etching, are not shown.

Then the backside BS of the wafer 600 is structured by employing lithographic processes. First a thin layer of insulating oxide 619, e.g. $SiO_2$, is formed on the backside BS via thermal oxidation—FIG. 9.9. Afterwards this thin layer of insulating oxide 619 is covered with a spray coating of photo resist 609—FIG. 9.10. The thin layer of insulating oxide 619 could be omitted and the following etching could be done using a resist-mask, but doing so would not be advantageous since the following lithographic steps include etching of up to 50 µm of silicon.

The photo resist layer 609 is exposed by means of e.g. a laser-beam writer. To this end, one of the alignment marks on the backside BS of the wafer 600 is detected and with this reference the desired pattern is exposed in the resist-covered membrane region on the backside BS. The exposed pattern is well aligned to the previously produced recesses 604, 605. After the laser beam lithography the photo resist layer 609 is developed—FIG. 9.11.

Employing RIE, the resist masked pattern is transferred into the thin layer of insulating oxide 619—FIG. 9.12. In a next step, the photo-resist is removed and a recess 611 is formed in the bulk layer using etching techniques, e.g. RIE—FIG. 9.13. This recess 611 will later on figure as depression accommodating the deflecting electrode. The recess surrounds at least one central portion 612 of bulk material which is designated for forming the electrode.

Subsequently, the laser beam lithographic process is applied a second time to the backside BS of the SOI wafer. A photo resist layer is deposited on the backside BS and exposed by means of laser beam lithography. After development of the photo resist layer, RIE is again used to structure the backside BS of the wafer 600. The recess 611 now extends from the backside BS of the wafer 600 through the bulk layer 601 to the buried silicon oxide layer 602. FIG. 9.14 shows only the result of these process steps.

The second application of the laser beam lithographic process may be omitted; in this case the photo-resist (and therefore the thin layer of insulating oxide) would be patterned differently. As a consequence the recess would reach to the buried silicon oxide layer 602 already after the first use of RIE, with the top of the electrode equaling the surface level of the backside BS of the SOI wafer.

In a next step, the etching is continued until the aperture goes through the entire wafer 600—FIG. 9.15. The etching may be done from the topside TS or the backside BS. It shall be noted that the silicon oxide layer 602 is undercut in the course of this process step. This helps to prevent the silicon oxide layer 602 to get charged by particles of the particle beam. The undercut structure is highlighted by circles 610 in FIG. 9.15. Finally, the structures on the topside TS are covered with a protective metal layer 611—FIG. 9.16.

FIG. 9.16 now shows the deflecting electrode 612 associated with the aperture 614, located in the depression 613. The electrode is connected to the CMOS-layer 606 via the metal contact 607 that is accommodated in the recess 605, said metal contact 607 traversing the silicon oxide layer 602.

Figure 10:
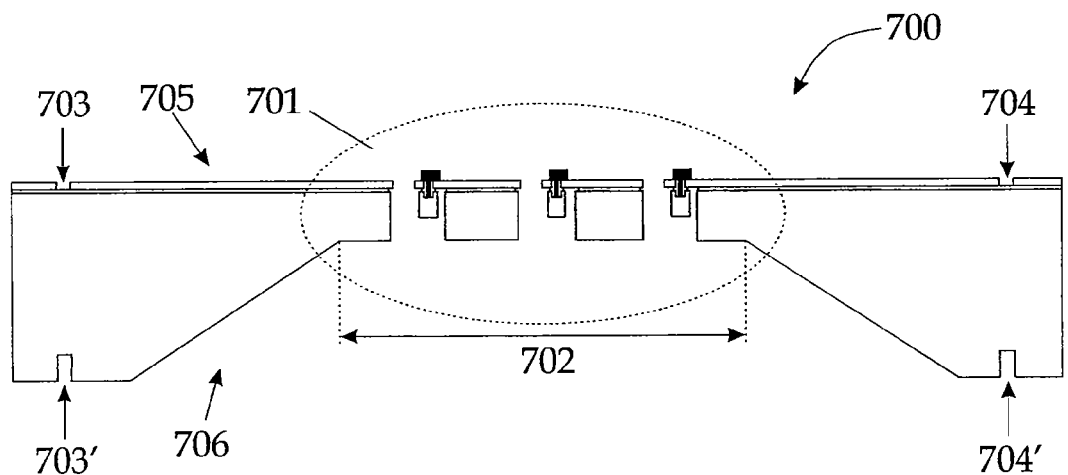
FIG. 10 a longitudinal schematic section of a multi-beam deflector array device according to the invention.

A longitudinal sectional schematic view of an entire DAP 700 produced by the method discussed above is depicted in FIG. 10. The DAP 700 has a topside 705, which may be directed towards the incoming beam of particles and a backside 706 opposing. Since some layers of the DAP have a minuscule thickness compared to the bulk layer and can not be rendered in FIG. 10 with actual accuracy, they are omitted for the sake of clearness. However this is not intended to impose a restriction of any kind to the invention. FIG. 10 shows a membrane region 701, where the depressions with the apertures and the associated electrodes are located. In a possible variant, a SOI wafer blank with a diameter of 150 mm is used. Such a wafer can accommodate up to eight DAPs, each measuring 30 mm square.

The membrane region 701 has an e.g. quadratic shape and is surrounded by a frame having a substantial thickness, e.g. 650 µm. The side length 702 measures 20 mm. The thickness of the bulk material in the membrane region 701 is about 50 µm. Only three from a multitude of apertures actually present are shown in FIG. 10 for clarity. Depending on the design at hand, one deflector array means may have more than one membrane region, separated by areas of higher thickness. Since the fabrication process involves process steps on both sides of the DAP, alignment marks 703, 704 on the topside 705 of the DAP 700 and associated alignment marks 703', 704' on the backside 706 allow for aligning the structures on either side. The provision of two pairs of alignment marks here is only exemplary; any reasonable number of alignment marks is possible.

In another possible fabrication method which is outlined below, the membrane region extends over the whole wafer. Therefore the whole wafer is thinned to a thickness of e.g. 50 µm.

The first process steps are similar to the ones of the fabrication method explained in detail above, depicted in FIGS.

9.1-9.7. FIG. 9.7 describes the deposition of a protective layer 608 on the topside TS of a SOI wafer. In the method described here, the topside of the SOI wafer is then bonded to a carrier wafer. Subsequently the whole wafer is thinned to a thickness of e.g. 50 μm. CMP is employed to get a smooth surface. The next process steps of structuring the backside of the SOI wafer are again similar to the steps pictured in the FIGS. 9.8-9.16 of the first fabrication method. Any alignment marks provided on the backside of the SOI wafer to allow for alignment of the structures on the topside and the backside have to be deep enough to endure the thinning of the wafer.

Typical Dimensions

Figure 11:
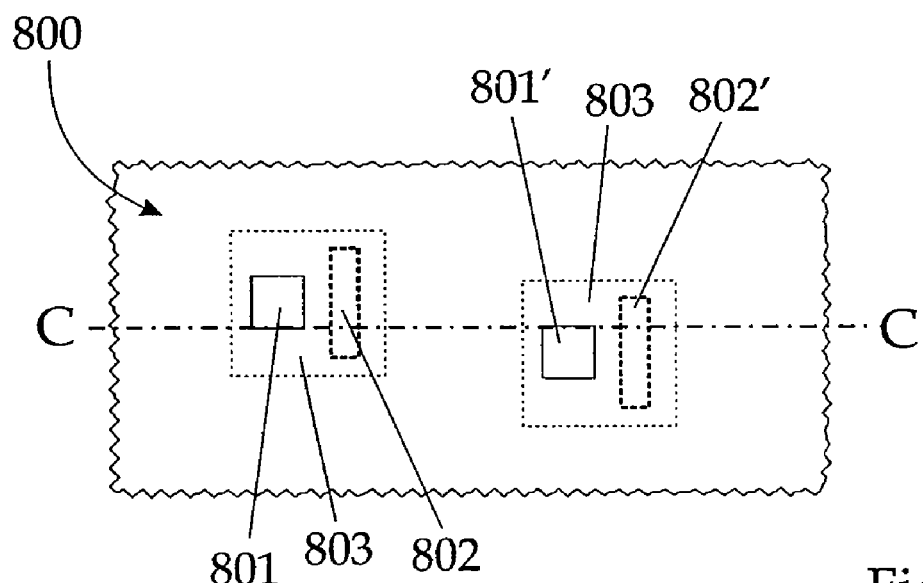
FIG. 11 a top view on a region with two apertures of the device of FIG. 10.

FIG. 11 shows a top view of an area of the membrane region 701 of a DAP 800 like the one shown in FIG. 8 with two apertures 801, 801' and the associated deflecting electrodes 802, 802', located in the depressions 803, 803'.

Figure 12:
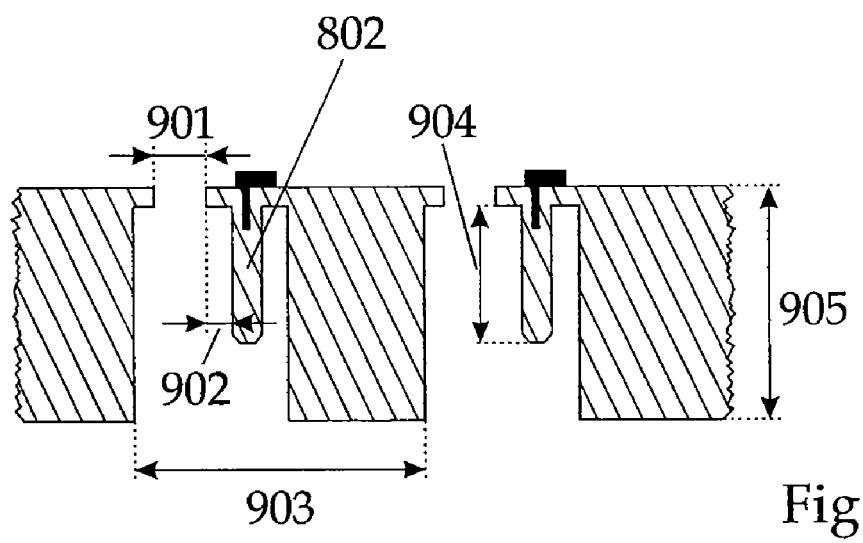
FIG. 12 a section of the device of FIG. 10 along the line C-C.

FIG. 12 shows a cross section along the line C-C of FIG. 11, giving an overview of typical dimensions of a DAP. For the sake of clearness, only the shape of the DAP is depicted with any internal structures omitted. The width 901 of an aperture may be 5 μm. A typical value of the distance 902 between the edge of the aperture next to the deflecting electrode 802 and the side of the deflecting electrode 802 facing the aperture is 2 μm. It may be possible to decrease this distance to 1 μm, however this size is limited by the top-to-backside alignment tolerance. A smaller distance 902 would be advantageous since a lower voltage would be needed to control the beamlets. The periodicity 903, meaning the distance between corresponding edges of neighboring depressions, is about 30 μm. The thickness 905 of the substrate is 50 to 60 μm. The height 904 of an electrode is preferably around 40 μm—the height 904 may as well equal the thickness of the substrate, as long as the electrode does not protrude beyond the surface of the substrate.

Figure 13:
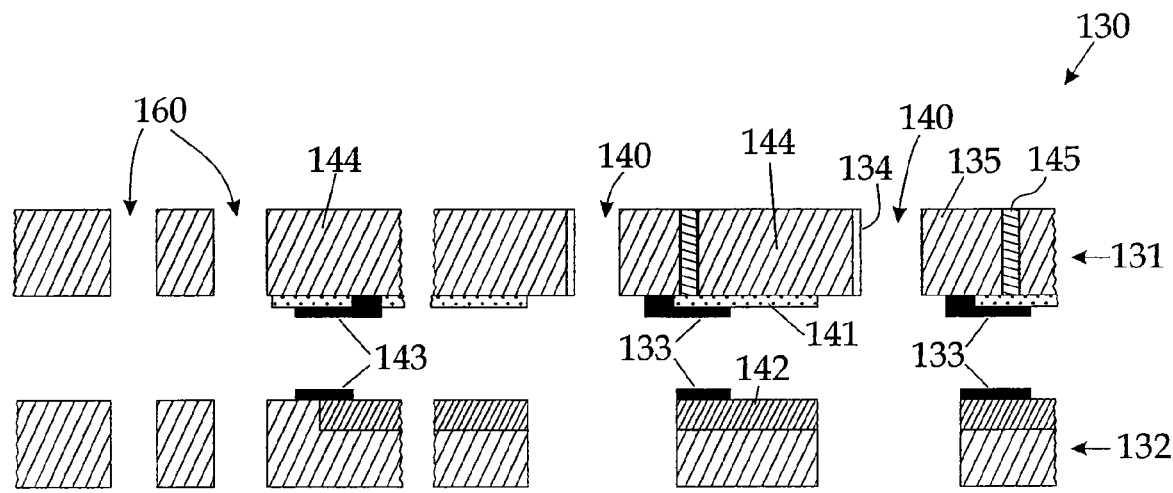
FIG. 13 a longitudinal section of a two-plate embodiment of a deflection array device according to the invention.

Two-Plate DAP FIG. 13 shows another embodiment 130 of a DAP. It consists of two plates 131, 132 produced from silicon wafers and bonded together by means of bonding pads 133. The DAP 130 is combined with an aperture array plate of the type shown in FIG. 3 or 4.

The plates 131, 132 serve specific purposes in the DAP 130. Plate 131 comprises the deflecting electrodes for each of the openings 140, whereas plate 132 contains an electronics layer 142 (for instance, CMOS layer) with the complete electric circuitry needed for processing and intermediate storing of the pattern data which are then fed through the bonding pad contacts to the deflecting plate 131. (The inner structure of the electronics layer 142 is omitted in the figures.) The plates 131, 132 are depicted separated in the figure for the sake of clarity; for operation they are permanently joined by bonding, and the bonding pads 133 not only provide a mechanic connection of the plates 131, 132, but also defined electric contacts between the electronic components of the plates 131, 132 as explained further below. The openings formed in plate 132 are considerably wider than the openings in plate 131 so as to allow for adjusting tolerances and reduce undesirable interactions between the particle beam and the circuitry of the electronics layer 142.

Figure 14:
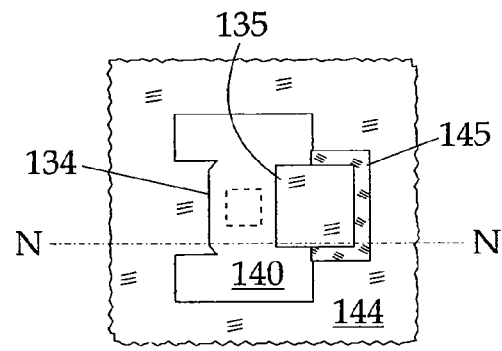
FIG. 14 a plan view of one opening of the deflector array means of FIG. 13.

One advantageous design of the openings is now discussed with reference to FIGS. 13 and 14. FIG. 14 represents a plan view on one opening 140 in plate 131, with the section shown in FIG. 13 running along line N-N of FIG. 14. With each opening 140, a deflecting electrode 135 is provided, while the face 134 opposing the deflecting electrode serves as a counter electrode. The counter electrode face 134 may advantageously be formed so as to protrude into the opening 140, preferably with a concave surface, to allow for a defined electric field configuration. While the deflecting electrode 135 is electrically insulated from the surrounding bulk material 144 of the wafer membrane region (e.g. membrane region 701 in FIG. 10), the counter electrode face 134 may be formed directly on the bulk material 144, in which case all deflecting electrodes of plate 131 will operate against a common ground potential of the bulk material 144. The ground potential is maintained by grounding pads 143 which are formed outside the membrane region; additional grounding pads may be present between the apertures in order to enhance the stability of the ground potential over the aperture field (reduction of stray inductivities).

The deflecting electrodes 135 are connected with the bulk material 144 by a supporting material 145 which either itself has insulating property (e.g., silicon oxide or silicon nitride) or shares an insulating interface (for instance produced by surface oxidation) with the material of the deflecting electrode 135 and/or the bulk material 144. As already mentioned, each deflecting electrode 135 is associated with a pad 133 which serves as a feeding connection for the electric potential to be applied to the electrode. The connecting pads 133 are insulated from the bulk material 144 by means of an insulating layer 141. The insulating layer may be provided only in specific areas of the membrane region as shown as a support layer of the pads 133 perforated only at specific locations, namely, to form electric connections of the pads 133 with the respective electrodes 135. In a variant, it may extend over the entire membrane region except for the mentioned perforations to form electric connections and windows for the openings 140.

A typical value of the distance between the deflecting electrode 135 and the counter electrode face 134 is about 5 to 6 μm. Plate 131 has a membrane of thickness of about 20 to 80 μm, while the CMOS plate 132 may have a thickness of about 25 to 40 μm. The width of the openings in the CMOS plate may vary, as long as it leaves the openings 140; for instance 9 μm or more may be allotted. The required accuracy of bonding position is about ±2 μm. Of course, regarding the aperture array plate cf. FIGS. 3 and 4, the apertures are, with regard to their lateral dimensions, embedded within the openings 140 of the DAP 130; their position is symbolically depicted as a dashed square in FIG. 14. The width of an aperture may be, e.g., 3.75 μm, with the thickness of the aperture array plate being about 10 to 20 μm.

Fabrication Process of Two-Plate DAP

An exemplary fabrication process for plate 131 of FIGS. 13 and 14 is discussed hereinafter with reference to FIGS. 15.1 ff (sectional details illustrating the production of two out of many openings). The process starts with an SOI wafer blank 650—FIG. 15.1—which comprises a bulk layer 651 whose surface side is referred to again as "backside" BS', a buried silicon oxide layer which is e.g. 300 nm thick and serves as an etch-stop layer 652, and a silicon layer 653 of e.g. 50 μm thickness at the "topside" TS'. If available topside silicon layers have a thickness lower than the desired start thickness, in this case 50 μm, a silicon layer 653 of desired thickness may be produced by epitaxial growth of silicon on the initial top layer.

At the location of the prospective openings 140, recesses 656 are defined on the topside of the wafer 650, for instance by well-known lithographic methods, and etched by means of anisotropic etching such as RIE—FIG. 15.2. The recesses preferably stop at the etch-stop layer 652. The shape of a recess 656 is a C-like shape as shown in the plan view of FIG. 16. Each recess 656 thus surrounds and defines a nose 655 of the topside layer which is destined to become the deflecting electrode 135 (see also FIG. 14).

In a next step, the sides of the recesses 656 are provided with an insulating cover, for instance by means of an oxidization process. (The resulting oxide layers are depicted as thick vertical lines.) Then, the recess is filled with material, for instance with a-silicon or poly-silicon. This step procures the supporting material 145 which will later provide the mechanical support of the electrode 135. The result of this step is shown in FIG. 15.3.

As an alternative during the step of FIG. 15.3, the step of insulating the sides of the recess 656 may be omitted if subsequently an insulating supporting material is filled in, as shown in FIG. 15.3a.

Subsequently recesses 657, which are to become the openings 140 as shown in FIG. 14, are formed on the topside of the wafer. For this, each of the recesses 657 has a shape which connects with the supporting material filled into the respective former recess 656 at two locations, so as to separate the portion 655 (the precursor of electrode 135) from the layer 653. The recesses are etched using the layer 652 as etch-stop layer; in a variant of the process (not shown), the recess could be etched so as to extend through the oxide layer 652 into the bulk layer 651. The process methods for forming the recesses, in particular anisotropic etching, are well-known methods of the state of the art. The result of this step is shown in FIG. 15.4.

The amount of supporting material 145 may be chosen just sufficient to mechanically connect the electrode 135 with the bulk material 144 and support it during the consecutive fabrication process and operation while ensuring reliable electrical insulation with regard to the topside layer 653.

In the next step, electrical contacts are formed for the electrode portions 655. Insulator layer areas 141 and on top of them contact pads 133 are deposited and connected to form electrical contacts of the electrodes to be. It is important to note that the contact pads may be at a location well shifted laterally to the position of the electrodes. Simultaneously, the grounding pads 143 (FIG. 13) are made. The result of this process stage is shown in FIG. 15.5.

Thereafter, the backside 651 is thinned up to the etch-stop layer 652. FIG. 15.6 is the same as FIG. 15.5 but turned upside down since it is now the backside BS' which is processed. The thinning is preferably done only in membrane regions. Simultaneously the recesses 657 are opened towards the backside (as the etch-stop layer was removed there), thus forming the openings 140. The result of this step, shown in FIG. 15.7, is the finished plate 131 (the components of the plate 131 are shown with different dimensions as in FIG. 13 for the sake of clarity).

The corresponding plate 132 may be fabricated by means of known CMOS fabrication techniques. The layout of the electric circuitry is not part of the present invention, the reader is referred to the above-mentioned publications for further details about the DAP electronics. The plate 132 is provided a plurality of holes corresponding to the openings of plate 131 and, furthermore, comprises matching bonding pads for providing the electrical contacts to the plate 131.

The alignment made between the plate 131 and the CMOS plate 132 is made using alignments marks 160 which were formed simultaneously with the openings 130; otherwise, the alignment is made according to state-of-the-art techniques.

Finally, plate 131 is bonded with plate 132 employing, for instance, eutectic bonding technique. Thinning of plate 132 may be done before or after the bonding process.

Of course, further variants of the process described above are possible in addition to the already-mentioned variations. For instance, instead of an SOI wafer 650, other wafer types with a buried layer that can serve as etch-stop may be used. If the etch-stop layer is not insulating, an additional step providing an insulator layer may be inserted after the thin-etch step on the backside. Furthermore, the electrodes 135 may be reduced in size by an additional etch step, which is inserted before or after the step of filling in the support material, so as to produce electrodes 135 whose height is smaller than the thickness of the surrounding material 144.

Figure 16:
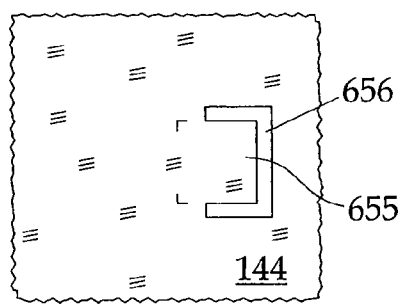
FIG. 16 a C-shaped recess in a plan view formed in the process step of FIG. 15.2.
Figure 17:
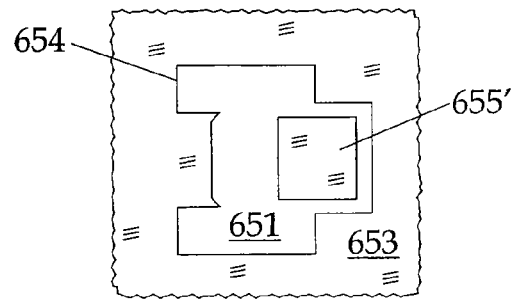
FIG. 17 an A-shaped recess in a plan view formed during a variant of the process flow.

In a notable variant of the fabrication process, regarding the steps of FIGS. 15.2 to 15.3, the recess etched into the top-side layer 653 may have a ring-like or preferably A-like shape as denoted as numeral 654 in the plan view of FIG. 17 (rather than in the shape 656 of FIG. 16). Thus, the shape of the electrode 135 is defined already in this step, as an island 655' of the topside layer. Subsequently, the sides of the recesses 654 are provided with an insulating cover, as explained above in relation to FIG. 15.3, and the recess is filled with the supporting material. After that, the process is continued just as explained above (the recess for the opening 140 is produced etc.) In the case that methods for partial filling of a material into a space are at hand, those methods could be used to provide the support material while not obstructing the recess, thus disposing the need to re-etch the recess 140.

Of course, the two fabrication process may also be suitably combined; the main stages of the fabrication method is the forming of recesses on the topside, thus producing structures in the topside layer at the location of the apertures, forming the depression with the electrode structures contained therein, and treatment of the backside, which will open apertures that extend through to corresponding recesses structured in earlier. For example, the first fabrication process (FIG. 9) could be modified for a two-plate device by leaving out the process steps for producing the CMOS-layer on the SOI wafer blank, and instead inserting process steps for producing pad fields like in the second fabrication process (FIG. 15.5).

We claim:

1. A multi-beam deflector array device for use in a particle-beam exposure apparatus employing a beam of charged particles (lb), said multi-beam deflector array device having an overall plate-like shape with a membrane region, said membrane region comprising:
   a first side facing towards the incoming beam of particles (lb) and a second side opposite to the first side,
   an array of apertures, each aperture allowing passage of a corresponding beam element formed out of said beam of particles,
   a plurality of depressions, each depression being formed in one of the sides of the membrane region and associated with at least one of the apertures, and
   an array of electrodes,
   wherein each aperture is associated with at least one of said electrodes and each electrode is located in one of said depressions, said electrodes being configured to realize a non-deflecting state, wherein the particles that pass through the apertures are allowed to travel along a desired path, and a deflecting state, wherein the particles are deflected off the desired path.

2. The multi-beam deflector array device of claim 1, wherein the depressions are formed in the first side.

3. The multi-beam deflector array device of claim 1, wherein the depressions are formed in the second side.

4. The multi-beam deflector array device of claim 3, wherein a beam forming layer is provided on the first side, with a plurality of retrograde stencil openings formed in said beam forming layer, each of said stencil openings coinciding with a subsequent aperture and each of said stencil openings having an inner width that is smaller than the inner width of the corresponding aperture.

5. The multi-beam deflector array device of claim 1, wherein the membrane region is composed of a semiconducting substrate material.

6. The multi-beam deflector array device of claim 1, further having a buried insulating layer between the electrodes and a layer containing circuitry for controlling said electrodes.

7. The multi-beam deflector array device of claim 6, wherein said buried insulating layer extends over the entire membrane region.

8. The multi-beam deflector array device of claim 1, wherein the membrane region comprises a semiconducting substrate material, said multi-beam deflector array device having a buried insulating layer between the electrodes and a layer of silicon oxide containing circuitry for controlling the electrodes.

9. The multi-beam deflector array device of claim 1, wherein the electrodes are made of the same material as a substrate material of the membrane region.

10. The multi-beam deflector array device of claim 1, wherein the electrodes are coated with a metallic material.

11. The multi-beam deflector array device of claim 1, wherein the electrodes do not protrude out of a surface level of the side of the membrane region the depressions are formed in.

12. The multi-beam deflector array device of claim 1, wherein the deflecting electrodes are contacted from the side of the membrane region opposite to the side of the membrane region the depressions are formed in.

13. The multi-beam deflector array device of claim 1, wherein the depressions have a diameter smaller than the distance between the first side and the second side of the membrane region.

14. The multi-beam deflector array device of claim 1, wherein the substrate material is configured to act as ground electrode to the deflecting electrode.

15. The multi-beam deflector array device of claim 1, wherein each aperture with its at least one deflecting electrode is associated with at least one ground electrode which is located in the depression that surrounds the aperture.

16. The multi-beam deflector array device according to claim 15, wherein the ground electrode and the deflecting electrode do not protrude out of a surface level of the side of the membrane region the depressions are formed in.

17. A method for producing a multi-beam deflector array device for use in a projection lithography system, namely a particle beam exposure apparatus, from a silicon-on-insulator (SOI) wafer blank with a layer of bulk material, a buried insulator layer covered by a silicon layer on a topside (TS) of the SOI wafer blank, opposite to a backside (BS) of said wafer blank, said method comprising:
  a) structuring of recesses on the topside (TS) of the SOI wafer blank, reaching through the silicon layer and the buried insulator layer into the layer of bulk material,
  b) forming a CMOS-layer on the topside (TS) of the SOI wafer blank on top of the silicon layer,
  c) depositing of a protective insulating layer on the topside (TS) of the SOI wafer blank, and
  d) structuring of the backside (BS) of the SOI wafer blank employing lithographic methods, forming electrodes as well as apertures extending through to the corresponding recesses that have been structured in an earlier step on the topside (TS).

18. The method of claim 17, wherein after step b), an insulating layer is deposited on the topside (TS), covering the topside (TS) of the SOI wafer blank.

19. The method of claim 18, wherein before step c), metal via contacts are applied to selected recesses on the topside (TS) that were produced in step a).

20. The method of claim 17, wherein before step d), the backside (BS) of the SOI wafer blank is thinned in the membrane region.

21. The method of claim 17, wherein after step d), a protective metal layer is deposited on the structures on the topside (TS).

22. The method of claim 17, wherein in step d) the buried insulator layer is undercut during the employment of lithographic methods.

23. A method for producing a multi-beam deflector array device for use in a projection lithography system, namely a particle beam exposure apparatus, from a silicon-on-insulator (SOI) wafer blank with a layer of bulk material, a buried insulator layer covered by a silicon layer on a topside (TS') of the SOI wafer blank, opposite to a backside (BS') of said wafer blank, said method comprising:
  a) structuring of recesses on the topside (TS') of the SOI wafer blank, reaching through the silicon layer to at least the buried insulator layer, said recess at least partially surrounding a respective portion in the silicon layer,
  b) at least partial filling of the recesses with a support material,
  c) restructuring of the recesses on the topside (TS') reaching through the silicon layer to at least the buried insulator layer, each of the recesses being formed into a shape wherein the recess including regions filled with said support material surrounds the respective portion in the silicon layer, electrically separating said portions from the remaining silicon layer,
  d) providing electrical contact means for said portions with the electrical contact means being electrically insulated against the remaining the silicon layer, and
  e) structuring of the backside (BS) of the SOI wafer blank, forming apertures extending through to the corresponding recesses that have been structured in an earlier step on the topside (TS').

24. The method of claim 23, wherein in step d), an insulating layer is formed onto the topside in specified areas at least adjacent to the locations of said portions, on which the electrical contact means are formed realizing contact pads.

25. The method of claim 23, wherein in step e), the backside (BS') is thinned in the membrane region.

26. The method of claim 25, wherein the backside is thinned removing the insulator layer.

27. The multi-beam deflector array device of claim 5, wherein the semiconducting substrate material is silicon.

* * * * *